United States Patent [19]
Hashimoto et al.

[11] Patent Number: 5,822,262
[45] Date of Patent: Oct. 13, 1998

[54] APPARATUS AND METHOD FOR A DYNAMIC RANDOM ACCESS MEMORY DATA SENSING ARCHITECTURE

[75] Inventors: Masashi Hashimoto; Keiichiroh Abe, both of Ibaraki, Japan, 305

[73] Assignee: Texas Instruments Incorporated, Dallas, Tex.

[21] Appl. No.: 882,472

[22] Filed: Jun. 25, 1997

Related U.S. Application Data

[60] Provisional application No. 60/020,370 May 25, 1996.
[51] Int. Cl.$^6$ ............................. G11C 7/02; G11C 8/00
[52] U.S. Cl. .................... 365/207; 365/208; 365/230.03
[58] Field of Search ................................. 365/207, 208, 365/230.03

[56] References Cited

U.S. PATENT DOCUMENTS

| | | | |
|---|---|---|---|
| 4,916,671 | 4/1990 | Ichiguchi | 365/207 |
| 5,295,111 | 3/1994 | Tsujimoto | 365/208 |
| 5,473,576 | 12/1995 | Matsui | 365/207 |
| 5,555,210 | 9/1996 | Kato | 365/207 |
| 5,590,080 | 12/1996 | Hasagawa et al. | 365/207 |
| 5,619,465 | 4/1997 | Nomura | 365/208 |

*Primary Examiner*—David C. Nelms
*Assistant Examiner*—Trong Phan
*Attorney, Agent, or Firm*—Robby T. Holland; William W. Holloway; Richard L. Donaldson

[57] ABSTRACT

In a dynamic random access memory unit, the voltage difference between bitline pairs, resulting from the transfer of charge between the bitline pair and a memory array ($5_L$), is amplified by an associated sense amplifier unit ($10_L$). A multiplicity of sense amplifier units ($10_1$–$10_M$) are activated by a sense amplifier driver circuit. (16, 18, 15 and 17) in typical operation. During a first period of time, a first transistor circuit (15 and 17) of the sense amplifier driver unit capable of providing a limited amount of charging current, activates the sense amplifier units ($10_1$–$10_M$). During a second period of time, the first transistor unit (15 and 17) and a second larger transistor unit (16, 18) activate the sense amplifier units. In order to provide a more effective activation during the first period, function of the first transistor circuit (15, 17) is performed by a plurality of transistor circuits ($15_1$–$15_L$, $17_1$–$17_N$) distributed along the conductors activating the sense amplifier units. During the first and second periods, transistors switches ($9_1$–$9_M$, $9_1'$–$9_M'$) isolate portions of the bitline pair from the sense amplifier units, eliminating the necessity for the sense amplifier to charge the isolated portion of the bitline pairs.

5 Claims, 4 Drawing Sheets

APPARATUS AND METHOD FOR A DYNAMIC RANDOM ACCESS MEMORY DATA SENSING ARCHITECTURE

This application claims priority to provisional application 60/020,370 filed on May 25, 1996 of inventor Hashimoto, et al.

BACKGROUND OF THE INVENTION

1. Field of the Invention

This invention relates generally to semiconductor memory units and, more particularly, to an architecture for data sensing in dynamic random access memory (DRAM) units that can reduce storage cell leakage current and shorten access time.

2. Description of the Related Art

In a dynamic random access memory (DRAM) unit, several factors limit the time required to access the storage cells. One of the factors is the relatively large capacitance of the bitline conductor as compared to the capacitance of the storage cell capacitor. Because of the relative sizes of these two capacitances, a relatively small voltage difference is developed between the bitline conductor pair as a result of coupling the storage cell capacitor to the bitline conductor pair. The voltage difference between the bitline conductor pair is given by $$dV = VDD/2 \times \{Cs/(Cb+Cs)\}$$

where

Cs is the storage cell capacitance,

Cb is the bitline conductor pair capacitance,

VDD is the supply voltage, and dV is the voltage difference between the bitline pair.

For a supply voltage (VDD) of three volts and a ratio of capacitances of Cb/Cs=20, the voltage difference between the bitline pair is 71 mV.

In order to detect the small voltage difference, a two (or more) step sensing system is being used. Referring to FIG. 1, typical apparatus for performing the two step amplification process for a group of memory arrays, e.g., memory array $5_Y$, is shown. A bitline conductor from memory array $5_Y$ is coupled to a drain terminal of p-channel field effect transistor $11_Y$, to a drain terminal of n-channel field effect transistor $13_Y$, to a gate terminal of p-channel field effect transistor $12_Y$, and to a gate terminal of n-channel field effect transistor $14_Y$. A bitline_ conductor is coupled to a drain terminal of transistor $12_Y$, to a drain terminal of transistor $14_Y$, to a gate terminal of transistor $11_Y$, and to a gate terminal of transistor $13_Y$. The source terminal of transistor $13_Y$ is coupled to a source terminal of transistor $14_Y$, to a drain terminal of n-channel field effect transistor 17, and to a drain terminal of field effect transistor 18. The source terminal of transistor 17 and the source terminal of transistor 18 are coupled to ground potential. The gate terminal of transistor 17 has the S1 signal applied thereto, while the gate terminal of transistor 18 has the S2 signal applied thereto. The source terminal of transistor $11_Y$ is coupled to a source terminal of transistor $12_Y$, to a drain terminal of p-channel field effect transistor 15, and to a drain terminal of p-channel field effect transistor 16. The source terminal of transistor 15 and the source terminal of transistor 16 are coupled to the VDD supply. The gate terminal of transistor 15 has the S1_ signal applied thereto, while the gate terminal of transistor 16 has the S2_ signal applied thereto. Transistor 15 and transistor 17 are smaller transistors (i.e., can conduct less current) than transistor 16 and transistor 18. Transistors $11_Y$, $12_Y$, $13_Y$, and $14_Y$ comprise the sense amplifier unit $10_Y$. Transistors 15, 16, 17, and 18 comprise the sense amplifier driver unit.

Referring next to FIG. 2A, the idealized voltages associated with the operation of each sense amplifier unit (e.g., $10_Y$) associated with the memory arrays shown in FIG. 1 is illustrated. A (WORDLINE ON) signal causes a memory cell capacitor to be electrically connected to the bitline pair and to share the charge therewith. Prior to the coupling of the memory cell to the bitline pair, the voltages of the two conductors of the bitline pair are equal and is approximately VDD/2. As a result, at t=0 the memory cell capacitor is coupled to the bitline pair and the stored charge is shared with the bitline conductor pair. A voltage difference between each member of the bitline pair is generated. Because of the bitline parasitic resistance and capacitance, the voltage difference between the members of the bitline pair takes a time T1 to develop. At time T1, the S1 signal is applied to the gate terminal of transistor 17 and the S1_ signal is applied to the gate terminal of transistor 15, transistors 17 and 15 being the small transistors of the sense amplifier. Therefore, from time T1, the small sense amplifier driver circuit is activated and amplification of the small voltage difference between the bitline conductors begins. This amplification continues until time T2. At time T2, the S2 signal is applied to transistor 18 and the S2_ signal is applied to transistor 16, transistors 16 and 18 being the larger transistors. After the time T2, the large sense amplifier driver circuit is activated and the bitline pair voltage difference amplification is provided at an increased rate until the maximum voltage difference (approximately VDD) between the bitline conductor and the bitline_ conductor is achieved. The signal difference amplification speed, dV/dt, is determined by sensing circuit sensitivity and the parameters mismatch. Premature activation of the larger sense amplifier driver circuit may result in an erroneous data sensing operation. While FIG. 2A provides an idealized view of the bitline pair voltage difference amplification, FIG. 2B provides a more realistic view of the voltage difference amplification. Shown are the bitline pair voltage differences proximate (near) to the sense amplifier driver amplifier(s) and removed (i.e., at a distance) from the sense amplifier driver circuits. FIG. 2B illustrates that the time T2 at which the signal S2 should be applied is a function of the distance of the sense amplifier from the sense amplifier driver circuit. In order to improve the operational speed of the memory unit, the delay in time $T2_{FAR}$ for the remote sense amplifiers to reach a value wherein the larger sense amplifier driver circuit can be activated should be reduced and made approximately equal to the time $T2_{NEAR}$ at which the near sense amplifiers (i.e., near to the sense amplifier driver circuits) can be activated by the large sense amplifier driver circuit.

A need has therefore been felt for apparatus and an associated method reducing the time required for the sense amplifiers to generate the complete voltage difference between the bitline conductors in a dynamic random access memory unit. In addition, the apparatus and method should reduce the leakage current from the bitline conductor pair onto the storage capacitors of the memory cells on the voltage difference between the bitline conductor pair has been amplified.

SUMMARY OF THE INVENTION

The aforementioned and other features of the present invention are accomplished, according to the present invention, by dividing the small sense amplifier driver circuit into a plurality of smaller sense amplifier driver circuits. This plurality of smaller sense amplifiers is distributed to generally equalize the activating current for the sense amplifiers. Each of the smaller sense amplifier driver circuits are activated simultaneously, thereby minimizing the delay in charging all of the bitline conductor pairs. The delay results from distributed bitline conductor pair capacitance and resistance and from the distributed resistance and capacitance of the conductors coupling the sense amplifiers and the sense amplifier driving circuits. In addition, a gate circuit placed in each bitline conductor permits a portion of each bitline conductors coupled to the storage cells of the memory arrays to be isolated from the sense amplifier units and related circuits. This gate is closed when the large sense amplifier driver circuit is activated to isolate the bitline pair from the sense amplifier. Because the bitline conductor pair will be isolated before activating the large sense amplifier driver circuit, the developed voltage difference on the bitline pair will be kept at a relatively small value. The reduced voltage on the bitline pair coupled to the memory cells reduces the leakage current flowing therebetween. Also, the bitline conductor pair, having a large capacitive load, will be isolated from the associated sense amplifer and the sense amplifier driver circuit can more rapidly activate the sense amplifiers.

These and other features of the present invention will be understood upon the reading of the following description in conjunction with the Figures.

BRIEF DESCRIPTION OF THE DRAWINGS

FIG. 2A illustrates idealized voltage waveforms associated with the apparatus shown in FIG. 1, while

DESCRIPTION OF THE PREFERRED EMBODIMENT(S)

1. Detailed Description of the Drawings FIG. 1 and FIG. 2 have been described with respect to the related art.

Figure 3:
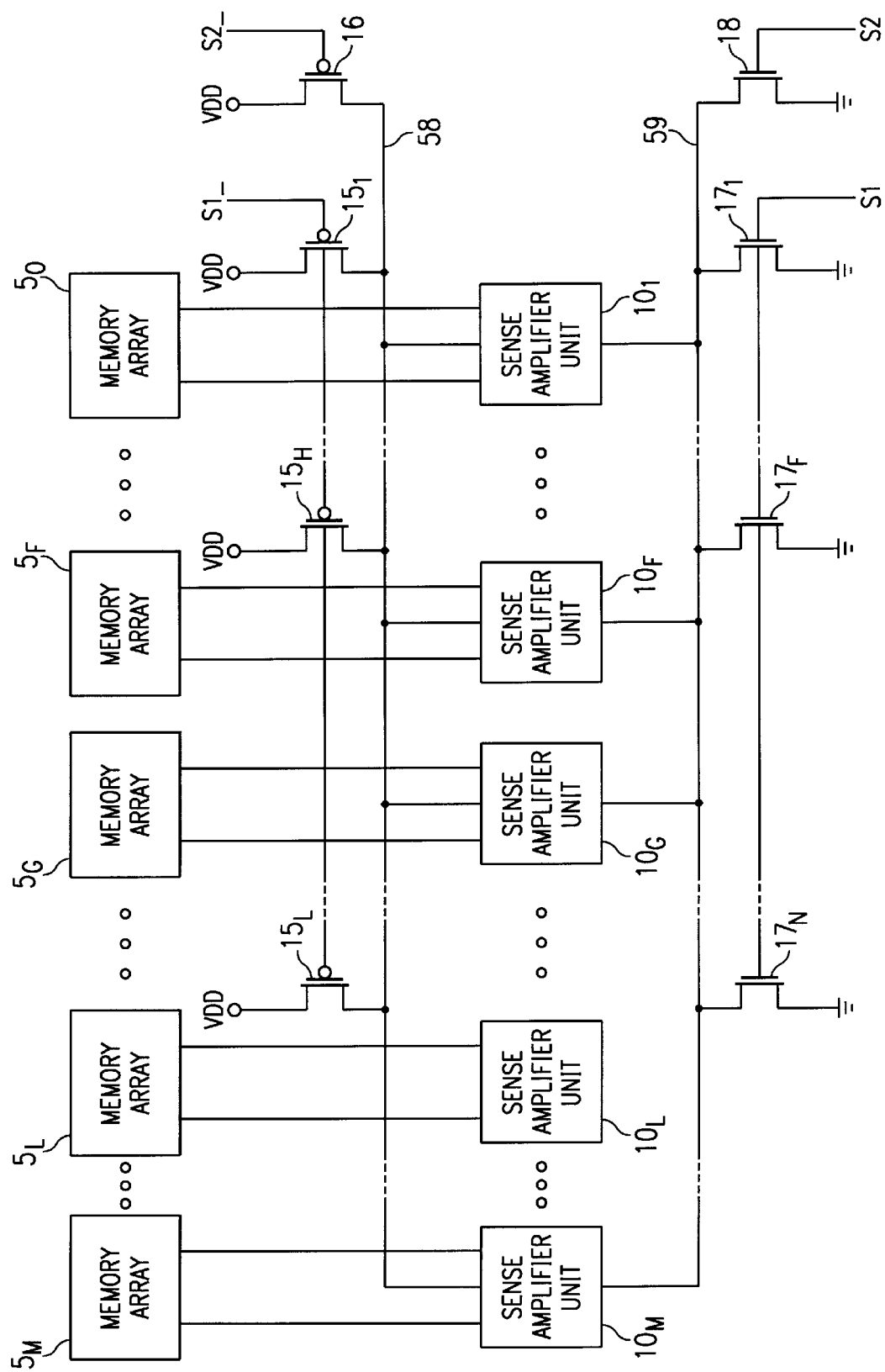
FIG. 3 is a schematic block diagram of sense amplifier units and sense amplifier driver circuits according to one aspect of the present invention.

Referring to FIG. 3, a schematic block diagram of the sense amplifier units along with the sense amplifier driver circuits in a dynamic random access memory unit according to the present invention is shown. A series of sense amplifiers $10_1-10_M$ are coupled between sense amplifier power lines 58 and 59 and respectively coupled to memory array's $5_1-5_M$. P-channel field effect transistor 16 has a drain terminal coupled to sense amplifier line power 58, a source terminal coupled to the VDD supply, and a gate terminal coupled to signal S2__. N-channel field effect transistor 18 has a drain terminal coupled to sense amplifier power line 59, a source terminal coupled to ground potential, and a gate terminal coupled to the S2 signal. A series of p-channel field effect transistors $15_1-15_L$ have the source terminals coupled to supply VDD, the gate terminals coupled to the S1__ signal and the drain terminals coupled at various locations along the sense amplifier power line 58. A series of n-channel field effect transistors $17_1-17_N$ have the source terminals coupled to the ground potential, the gate terminals coupled to the S1 signal, and the drain terminals coupled along the sense amplifier power line 59.

Figure 4:
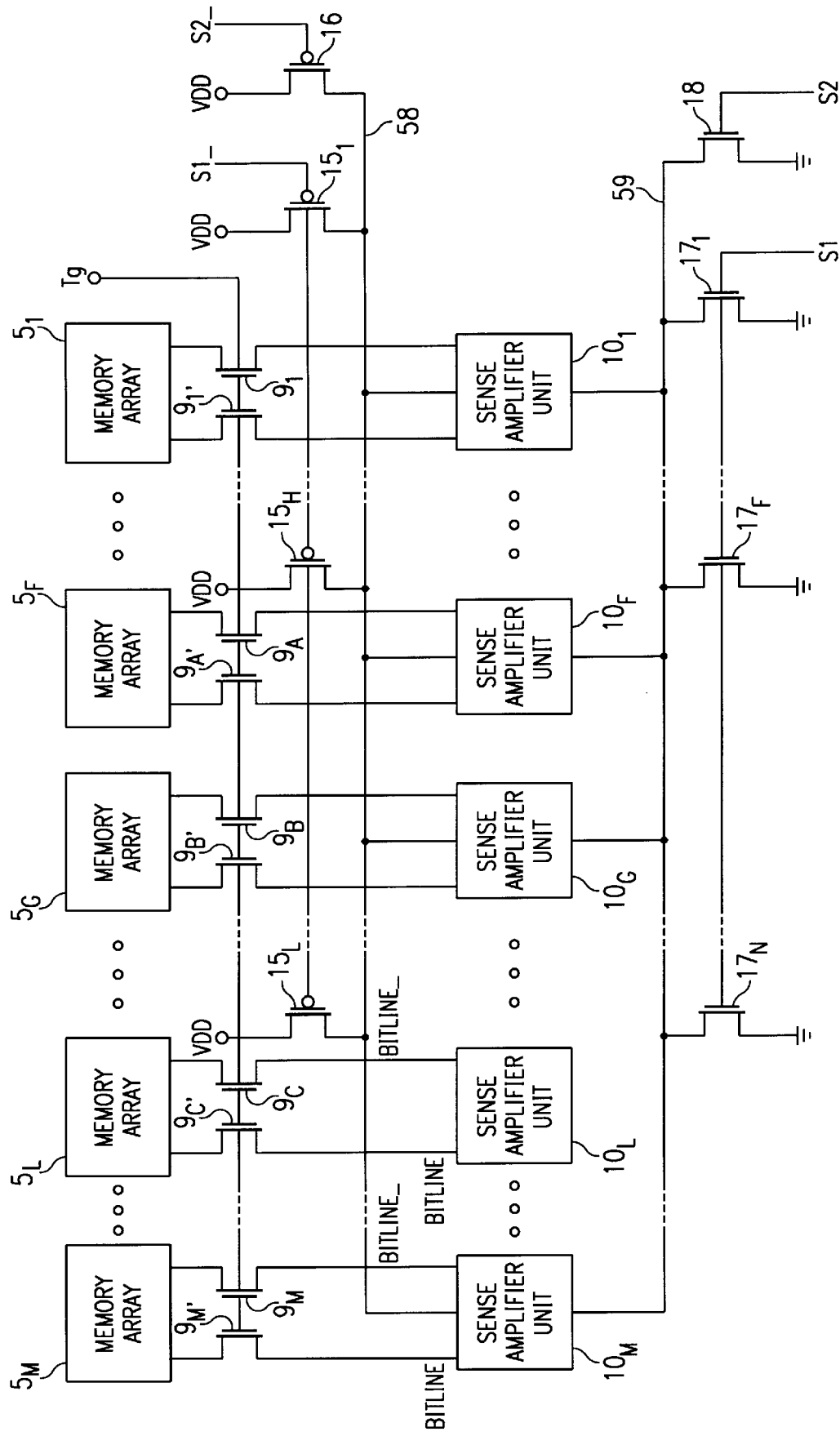
FIG. 4 is a schematic block diagram of sense amplifier units and sense amplifier driver circuits including a second aspect of the present invention.

Referring to FIG. 4, the sense amplifier unit/sense amplifier driver circuit configuration of FIG. 4 is shown with the addition of isolation gates $9_1-9_M'$. The isolation gates $9_1-9_M'$ are n-channel field effect transistors having a first source/drain terminal coupled to a bitline conductor and a second source/drain terminal coupled to a sense amplifier unit. The gate terminals of transistors $9_1-9_M'$ are coupled to the Tg signal.

Figure 5:
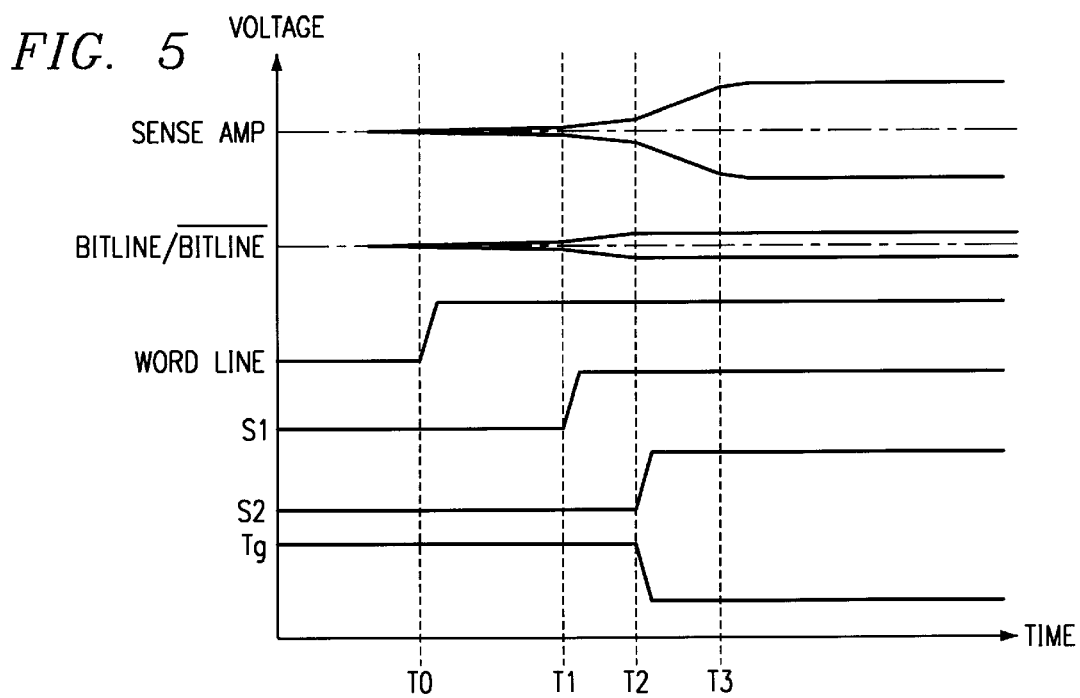
FIG. 5 is a illustrates the relative time dependence of selected voltage waveforms for the apparatus of FIG. 4.

Referring to FIG. 5, a diagram of the relationship of selected waveforms as a function of time is shown. The activity of the sense amplifier and related apparatus is initiated by the application of the WORDLINE signal at time $T_0$. The Tg signal, isolating the bitline conductors from the associated sense amplifiers, is applied before or simultaneously with the application of the S2, the signal activating the large sense amplifier driver circuit. Although S1__ and S2__ signals are not shown in FIG. 5, the S1__ and S2__ signal switching timings are the same as the S1 and S2 signals, respectively, differing only in the reversed polarity of the signals.

2. Operation of the Preferred Embodiment(s)

Figure 1:
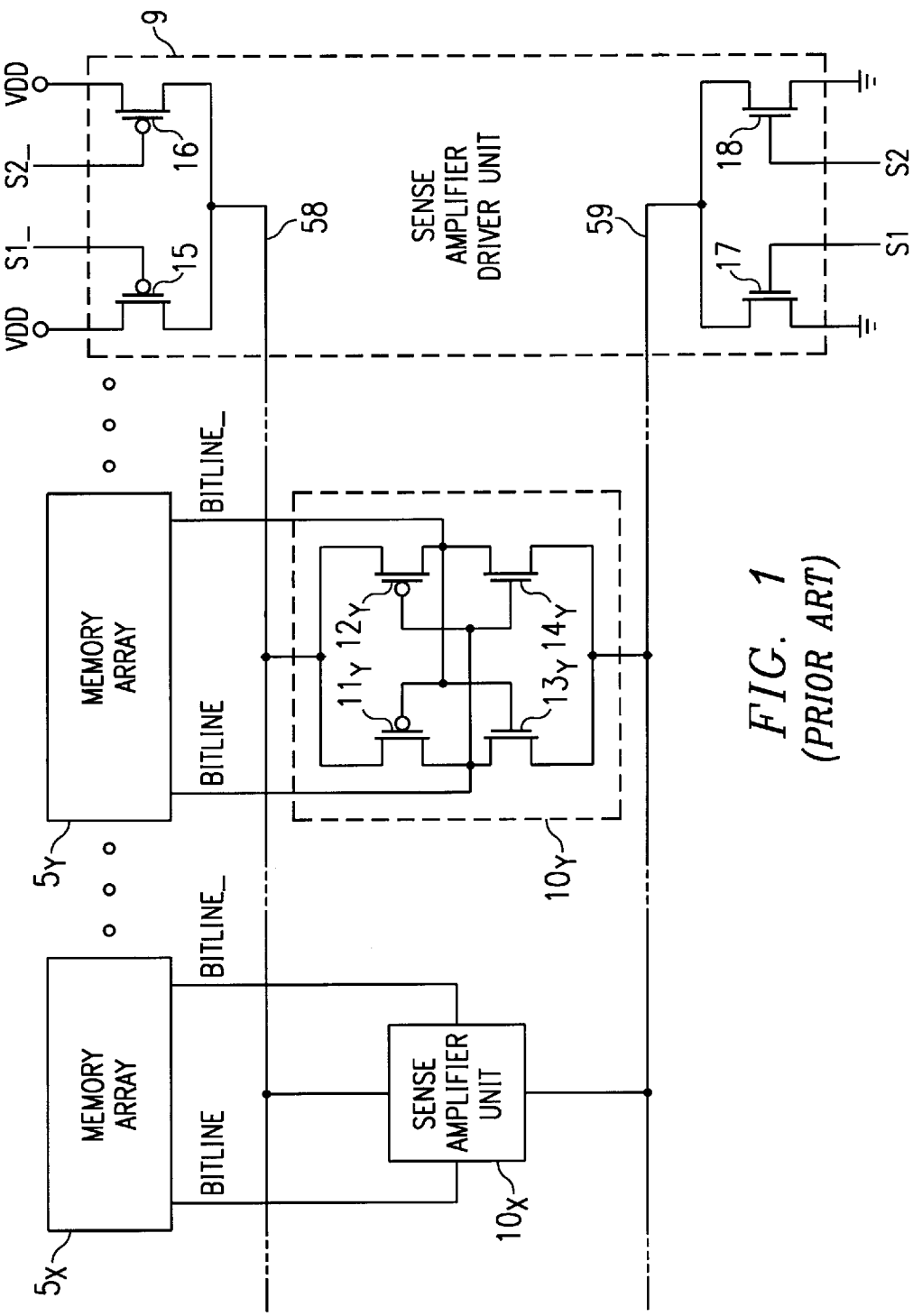
FIG. 1 is a schematic block diagram of sense amplifier units and sense amplifier driver circuits associated with memory unit according to the prior art.
Figure 2A:
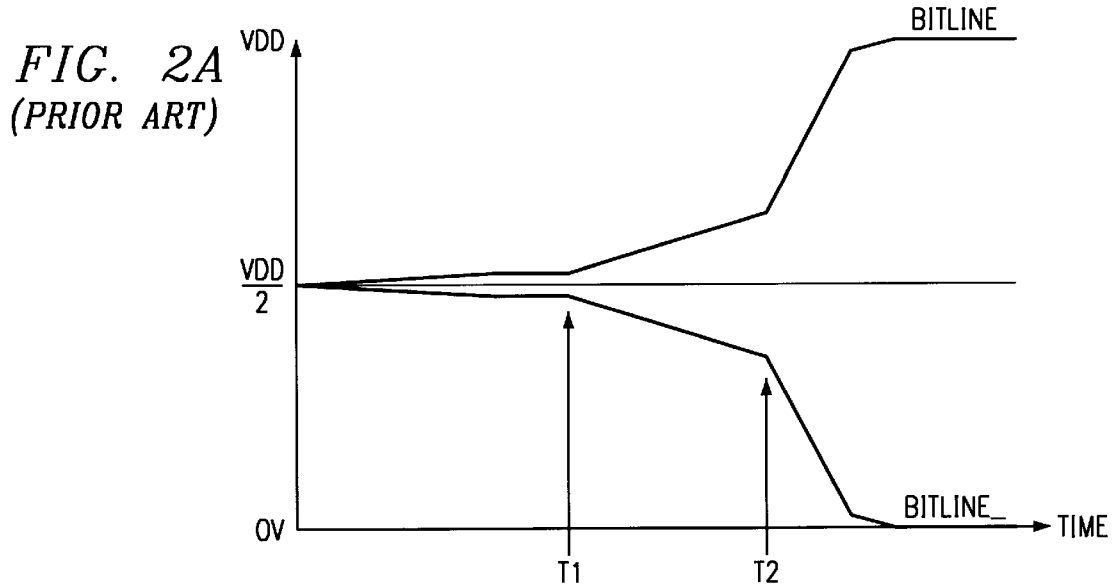
Figure 2B:
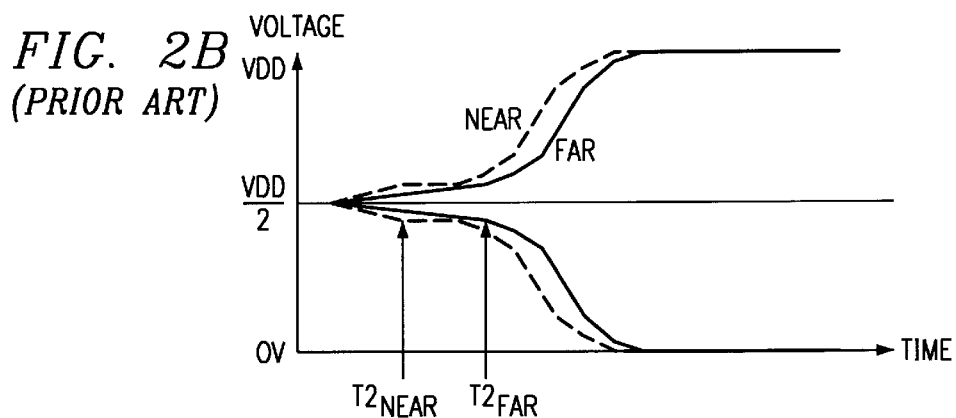
FIG. 2B shows more realistic voltage waveforms along the bitline conductor pair for the apparatus shown in FIG. 1.

Referring once again to FIG. 3 and comparing FIG. 3 with FIG. 1, the transistors 15 and 17 of FIG. 1 comprise the small sense amplifier driver circuit, while transistors 16 and 18 of FIG. 1 comprise the large sense amplifier driver circuit. In FIG. 3, the function of the small sense amplifier driver circuit (transistors 15 and 17) is now performed by a plurality of transistors $15_1-15_L$ and $17_1-17_N$. The plurality of transistors $15_1-15_F$ and $17_1-17_N$ are distributed along the conductors 58 and 59, the conductors 58 and 59 distributing power to the sense amplifiers. In this manner, the transients illustrated in FIG. 2B are reduced and the S2 and S2__ signals, activating the large sense amplifier driver circuit (transistors 16 and 18) the S2 and S2__ signals a shorter time after the application of the S1 and S1__ signals. The use of the distributed small sense amplifier driver circuit shortens the time to activate the large sense amplifier driver circuit and, by minimizing transients on the sense amplifier driver circuit conducting paths, reduces the chance for inaccurate storage cell signal identification.

The time required to provide the full voltage difference across the bitline pairs is further reduced by the gate transistors $9_1-9_M'$. The gate transistors remove much of the bitline conductor pair (distributed capacitance) being charged by the sense amplifier unit from the electrical circuit. This removal expedites the charging of the portion of the bitline pair still coupled to the sense amplifier unit.

While the invention has been described with particular reference to the preferred embodiment, it will be under stood by those skilled in the art that various changes may be made and equivalents substituted for elements of the preferred embodiment without departing from the invention. For example, the distributed small sense amplifier driver circuits shown in FIG. 4 can, in general, have a different number of p-channel and n-channel transistors. However, typically, this number will be the same. Similarly, the large sense amplifier driver circuits can be also be distributed. Furthermore, it is possible to apply the same distributed sense amplifier driver circuits concept to one stage sening operation (i.e., S1 and S1__ only, and not S2 and S2__). In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A dynamic random access memory unit, comprising:
   a plurality of memory arrays;
   a plurality of sense amplifiers, each sense amplifier coupled to an associated memory array by a bitline pair:
   a sense amplifier driver unit coupled to said plurality of amplifiers by a conducting path, said sense amplifier driver unit including;
   a first transistor circuit responsive to a first signal for activitating said plurality of sense amplifiers; and
   a plurality of second transistor circuits responsive to a second signal for activating said plurality of sense amplifiers, said plurality of second transistors being distributed along said conducting path and wherein said plurality of second transistor circuit is activated prior to activation of said first transistor circuit to amplify slowly, as compared to the first transistor circuit, a voltage difference between bitline pairs; and
   a transistor in each of said bitlines, said transistors responsive to a third signal for isolating said each memory array from said associated sense amplifier.

2. In a dynamic random access memory unit, a method of activating a first plurality of sense amplifier units distributed along a conducting path, the sense amplifier units amplifying a voltage difference between a bitline pair, the voltage difference resulting from the coupling of the bitline pair to a memory cell capacitor of a memory array, the method comprising the steps of:
   after said voltage difference is established, activating said sense amplifiers by a plurality of driver circuits distributed along said conducting path; and
   after a predetermined period of time, further activating said sense amplifier with at least one additional driver circuit.

3. The method of claim 2 further including the step of:
   electrically isolating a portion of each bitline coupled to said sense amplifier from a portion of each bitline coupled to said memory array after said voltage difference is established.

4. The method of claim 3 further including the step of implementing each of said driver circuits with a p-channel/n-channel transistor pair.

5. A method of amplifying a voltage difference in a bitline pair in a dynamic random access memory unit, said method comprising the steps of:
   after establishing a voltage difference between each bitline pair, activitating a sense amplifier unit coupled to each bitline pair by activating the sense amplifier with a weak driver circuit during a first period and activating the sense amplifier with at least one additional driver circuit during a second period of time; and
   implementing said weak driver circuit with a plurality of driver circuits along the conducting path coupling said sense amplifiers and said driver circuits.

* * * * *